(12) United States Patent
Morita et al.

(10) Patent No.: US 8,547,125 B2
(45) Date of Patent: Oct. 1, 2013

(54) TEST APPARATUS AND TEST MODULE

(75) Inventors: Tadashi Morita, Gunma (JP); Tetsuya Koishi, Gunma (JP); Takeshi Yaguchi, Saitama (JP)

(73) Assignee: Advantest Corporation, Tokyo (JP)

( * ) Notice: Subject to any disclaimer, the term of this patent is extended or adjusted under 35 U.S.C. 154(b) by 685 days.

(21) Appl. No.: 12/694,149

(22) Filed: Jan. 26, 2010

(65) Prior Publication Data

US 2011/0181309 A1    Jul. 28, 2011

(51) Int. Cl.
*G01R 31/3187* (2006.01)
(52) U.S. Cl.
USPC ............... 324/750.3; 324/762.01; 714/724; 702/117
(58) Field of Classification Search
USPC ............... 324/750.3, 762.01; 714/718, 724, 714/734, 738; 702/117–118
See application file for complete search history.

(56) References Cited

U.S. PATENT DOCUMENTS

| | | | |
|---|---|---|---|
| 7,096,139 B2* | 8/2006 | Miyazaki et al. | 702/117 |
| 7,340,364 B1* | 3/2008 | Kumaki | 702/118 |
| 7,640,132 B2* | 12/2009 | Katagiri et al. | 702/123 |
| 7,802,140 B2* | 9/2010 | Iwamoto | 714/27 |
| 2002/0070725 A1 | 6/2002 | Hilliges | |
| 2003/0005375 A1* | 1/2003 | Krech et al. | 714/724 |
| 2004/0255216 A1 | 12/2004 | Ichiyoshi | |
| 2005/0114550 A1 | 5/2005 | Kushnick | |
| 2005/0182583 A1 | 8/2005 | Miyazaki et al. | |
| 2005/0262414 A1 | 11/2005 | Elston et al. | |
| 2006/0224926 A1 | 10/2006 | Iwamoto | |
| 2008/0126899 A1* | 5/2008 | Brennan et al. | 714/732 |
| 2008/0133165 A1* | 6/2008 | Iwamoto et al. | 702/118 |
| 2010/0194421 A1* | 8/2010 | Iwamoto et al. | 324/763 |
| 2011/0057673 A1* | 3/2011 | Iwamoto et al. | 324/750.3 |
| 2011/0060933 A1* | 3/2011 | Iwamoto | 713/400 |

FOREIGN PATENT DOCUMENTS

| | | |
|---|---|---|
| JP | H5-215815 A | 8/1993 |
| JP | 2002-55145 A | 2/2002 |
| JP | 2007-256295 A | 10/2007 |
| JP | 2008-51581 A | 3/2008 |
| TW | I317817 | 12/2009 |
| WO | 2005/078463 A1 | 8/2005 |

OTHER PUBLICATIONS

Evans, "The New ATE: Protocol Aware", Test Conference, IEEE International, Oct. 2007, pp. 1-10, Santa Clara, CA.

(Continued)

*Primary Examiner* — Arleen M Vazquez (57) ABSTRACT

Provided is a test apparatus for testing at least one device under test, including: a test module that includes a plurality of test sections, the plurality of test sections testing the device under test by exchanging signals with the device under test; and a plurality of test control sections that control the plurality of test sections, where the test module includes the plurality of test sections; a setting storage section that stores setting as to which of the plurality of test control sections should be associated with each of the plurality of test sections; and an interface section that is connected to the plurality of test sections, provides an access request issued from one of the plurality of test control sections and directed to the test module, to a test section associated with the test control section, and is able to set, independently for each of the plurality of test sections, which of the plurality of test control sections should control the test section.

9 Claims, 9 Drawing Sheets

(56) References Cited

OTHER PUBLICATIONS

Japanese Office Action dated Feb. 22, 2011, in a counterpart Japanese patent application JP2011-007081. Concise Explanation of Relevance: the Japanese Office Action rejects claims in the Japanese application in view of Foreign Patent document Nos. 1-4 which has English abstract.

* cited by examiner

TEST APPARATUS AND TEST MODULE

BACKGROUND

1. Technical Field

The present invention relates to a test apparatus and a test module.

2. Related Art

A test apparatus for testing a device under test (DUT) includes a plurality of test modules. Each test module includes a plurality of test sections. Each test section is connected to a terminal of the DUT, to test the DUT.

A test apparatus for testing a plurality of DUTs in parallel includes a plurality of site controllers respectively corresponding to the plurality of DUTs. Each site controller controls the test section connected to a corresponding DUT to execute a test of the corresponding DUT.

A conventional test apparatus assigns a test section controlled by each of the plurality of site controllers, for each test module. With this configuration, however, there may exist a test section not used by any site controller.

For example, a DUT having 8 analog input/output terminals is tested using a test module including 12 analog test sections, 4 out of the 12 analog test sections will not be used. In this way, a conventional test apparatus occasionally fails to pursue effective use of resources of the test module.

SUMMARY

Therefore, it is an object of an aspect of the innovations herein to provide a test apparatus and a test module, which are capable of overcoming the above drawbacks accompanying the related art. The above and other objects can be achieved by combinations described in the independent claims. The dependent claims define further advantageous and exemplary combinations of the innovations herein.

According to an aspect related to the innovations herein, one exemplary test apparatus for testing at least one device under test, includes: a test module that includes a plurality of test sections, the plurality of test sections testing the device under test by exchanging signals with the device under test; and a plurality of test control sections that control the plurality of test sections, where the test module is able to set, independently for each of the plurality of test sections, which of the plurality of test control sections should control the test section.

According to an aspect related to the innovations herein, one exemplary test apparatus for testing at least one device under test, includes: a test control section that controls a test of the device under test; a plurality of test modules that conduct the test by exchanging signals with the device under test; and a connection section that connects the test control section and the plurality of test modules, where the test control section includes: a control processor that executes a program for controlling the test of the device under test; and a communication interface that processes communication between the test control section and the connection section by being controlled by the control processor, and when receiving a message to be transferred from one test module to another test module of the plurality of test modules, transfers the message to the other test module via the connection section.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
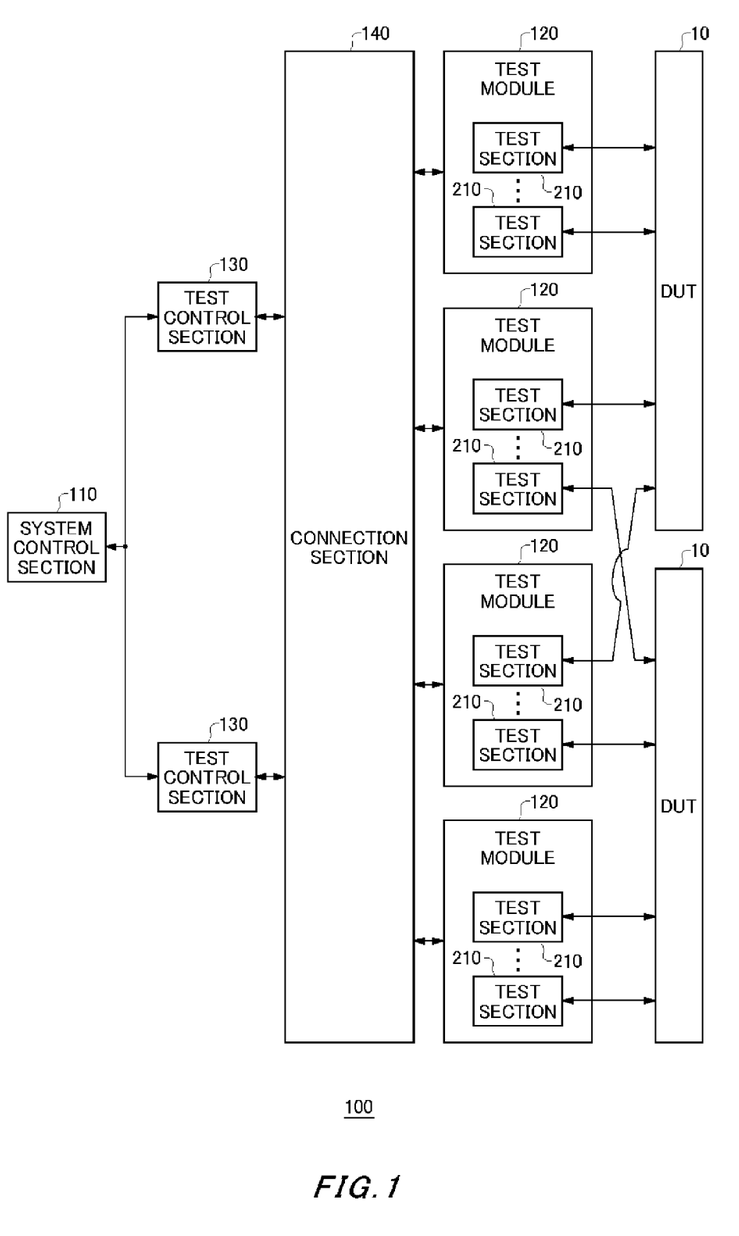
FIG. 1 shows a functional configuration of a test apparatus 100 according to a present embodiment, together with a plurality of devices under test 10.

FIG. 1 shows a functional configuration of a test apparatus 100 according to a present embodiment, together with a plurality of devices under test (DUT) 10. The test apparatus 100 tests at least one device under test 10. That is, the test apparatus 100 may test a single device under test 10 or may test a plurality of devices under test 10 in parallel.

The test apparatus 100 includes a system control section 110, one or more test modules 120, a plurality of test control sections 130, and a connection section 140. The system control section 110 is connected to the plurality of test control sections 130, to control the entire test apparatus 100. For example, the system control section 110 and the plurality of test control sections 130 are connected each other by means of a general or dedicated high-speed serial bus or the like.

Each of the one or more test modules 120 is a substrate installed in a test head, for example. Each of the one or more test modules 120 includes a plurality of test sections 210. Each of the plurality of test sections 210 is connected to a terminal of at least one of all the devices under test 10 to be tested by the test apparatus 100. Each of the plurality of test sections 210 exchanges a signal with the device under test 10 connected thereto, to test the device under test 10.

Each of the plurality of test control sections 130 is associated with one or more of the at least one device under test 10 to be tested by the test apparatus 100. Each of the plurality of test control sections 130 controls one or more test sections 210 connected to a corresponding device under test 10, in accordance with a control instruction, a test program, and so on provided from the system control section 110, to control the test of the corresponding device under test 10. That is, each of the plurality of test control sections 130 uses one or more test sections 210 as a resource, to control the test of the corresponding device under test 10. The connection section 140 connects the test control section 130 and the one or more test modules 120.

Here, each of the one or more test modules 120 can independently set which of the plurality of test control sections 130 should control a test section 210 of the plurality of test sections 210 of the test module 120, for each test section 210. Accordingly, each of the one or more test modules 120 can subject a part of the plurality of test sections 210 under control of the first test control section 130, and the other part of the plurality of test sections 210 under control of the second test control section 130.

In this way, the test apparatus 100 can independently and arbitrarily set the test control sections 130 that should control the plurality of test sections 210 of a single test module 120. Accordingly, the test apparatus 100 can conduct a test by efficient use of the resources within the test module 120.

Figure 2:
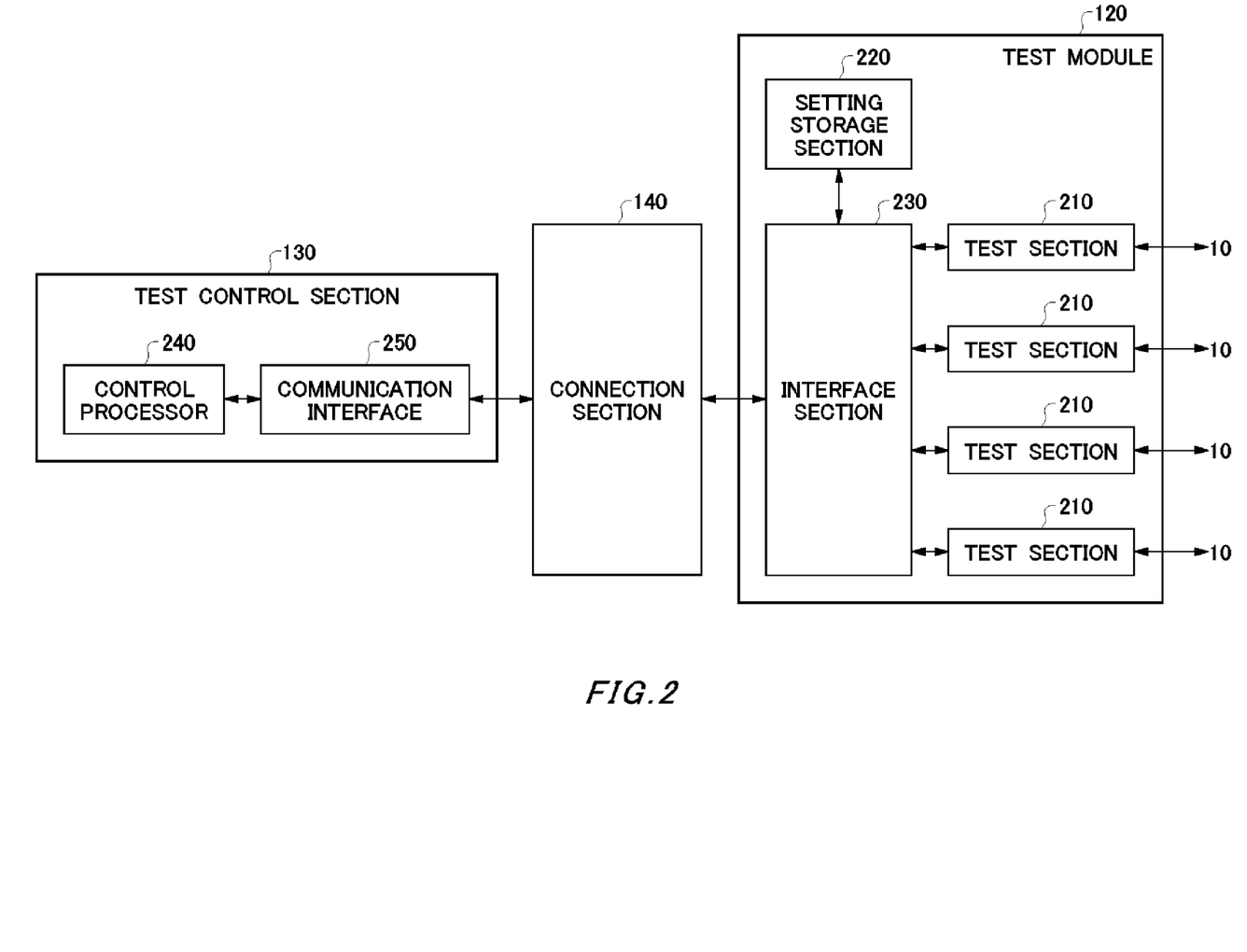
FIG. 2 shows a configuration of one of a plurality of test control sections 130, and a configuration of one of one or more test modules 120.

FIG. 2 shows a configuration of one of a plurality of test control sections 130, and a configuration of one of one or more test modules 120. The test module 120 includes a plurality of test sections 210, a setting storage section 220, and an interface section 230.

Each of the plurality test sections 210 is connected to a terminal of any one device under test 10. Each of the plurality of test sections 210 includes a processor or a sequencer for executing a test program. Each of the plurality of test sections 210 exchanges, with the device under test 10 connected thereto, a signal according to a test program provided by a corresponding test control section 130, to test the device under test 10.

The setting storage section 220 stores setting as to which of the plurality of test control sections 130 each of the plurality of test sections 210 should be associated with. In this example, the setting storage section 220 stores, for each test section 210, the identification number of one of the plurality of test control sections 130 that is associated with the test section 210. That is, the setting storage section 220 stores, for each test section 210, the identification number of the test control section 130 that controls the test of the device under test 10 connected to the test section 210. Such setting is written by the system control section 110 for example, prior to the test.

The interface section 230 is connected to the plurality of test sections 210. The interface section 230 exchanges an access request, an interrupt request, a message, etc., with the plurality of test control sections 130 via the connection section 140.

For example, the interface section 230 receives, via the connection section 140, an access request and a message issued from one of the plurality of test control sections 130 and directed to the test module 120. Then, the interface section 230 sends the received access request and message issued from the test control section 130 to the test module 120, to a test section associated with a test control section 130 in the plurality of test sections 210, based on the setting stored in the setting storage section 220.

In addition, the interface section 230 transmits, to each of the plurality of test control sections 130 via the connection section 140, an access result and an interrupt request in response to the access request, which are issued from one of the plurality of test sections 210 to a test control section 130, for example. Moreover, the interface section 230 transmits, to each of the plurality of test control sections 130 via the connection section 140, a message which is issued from one of the plurality of test sections 210 to the test section(s) 210 of another test module 120.

A test control section 130 includes a control processor 240 and a communication interface 250. The control processor 240 executes a program for controlling the test of the device under test 10.

The communication interface 250 processes communication between the test control sections 130 and the connection section 140 by being controlled by the control processor 240. For example, the communication interface 250 transmits, to a test module 120 via the connection section 140, an access request to a test section 210 of the test module 120. In addition, the communication interface 250 may receive an access result and a message transmitted from a test section 210 of a test module 120 to the test control section 130 associated therewith.

In addition, the communication interface 250 may also receive, from one of the plurality of test modules 120, a message to be transferred from the test module 120 to another test module 120. In response to reception of the message, the communication interface 250 transfers the message to the other test module 120 via the connection section 140.

Figure 3:
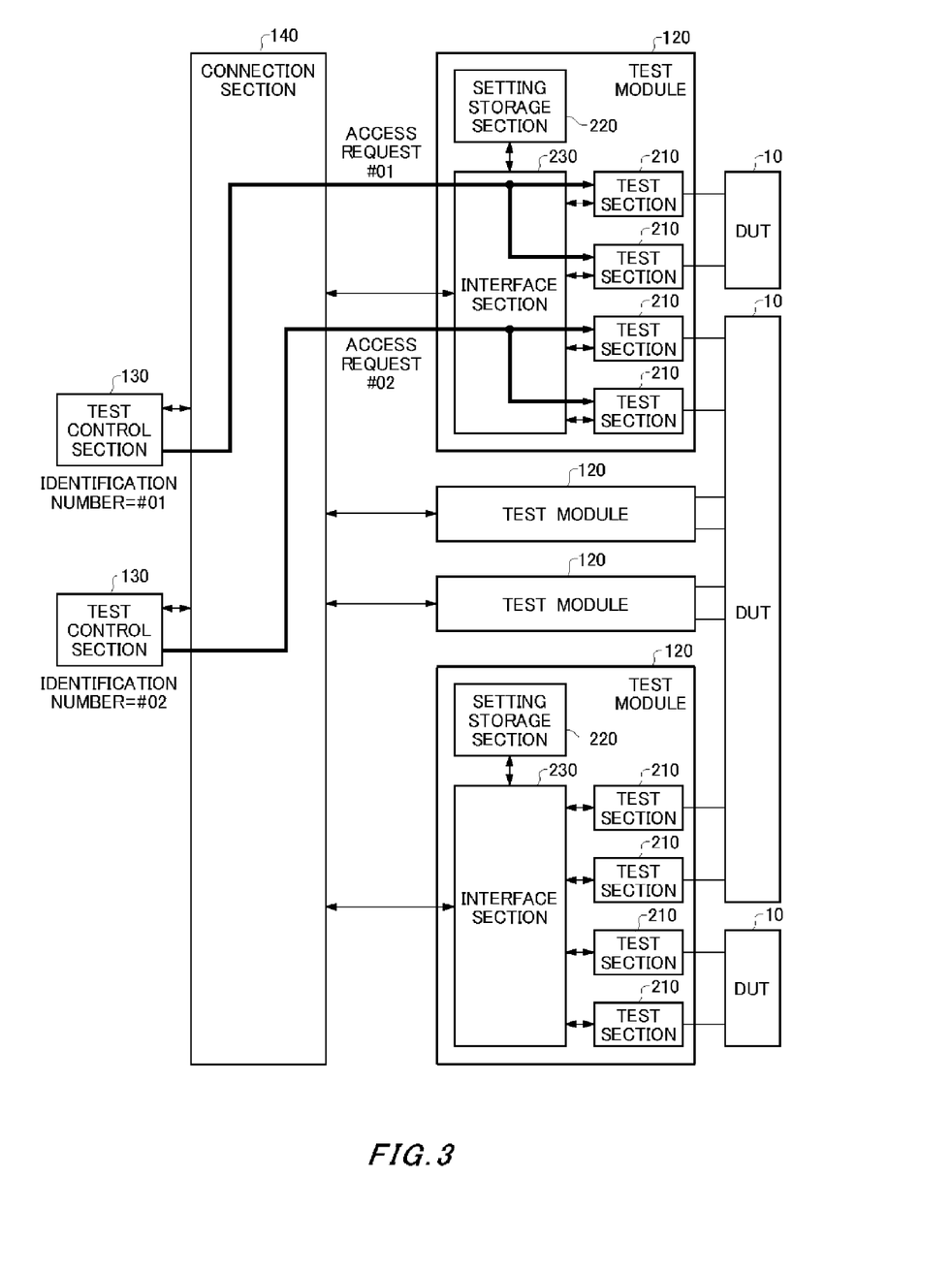
FIG. 3 shows an exemplary access request flow, when transmitting an access request from a test control section 130 to a test section 210 connected to a device under test 10 associated with the test control section 130.

FIG. 3 shows an exemplary access request flow, when transmitting an access request from a test control section 130 to a test section 210 connected to a device under test 10 associated with the test control section 130. A test control section 130, when controlling a test section 210 connected to a device under test 10 associated with the test control section 130, transmits an access request to the test section 210.

In such a case, a test control section 130 attaches an identification number identifying the test control section 130 to the access request, and transmits it to a test module 120 via the connection section 140. Then, the interface section 230 of a test module 120 receives an access request from a test control section 130.

The interface section 230 of a test module 120 reads, from the setting storage section 220, each one of the test sections 210 associated with the identification number attached to the received access request. The interface section 230 of the test module 120 then provides the received access request to each one of the read test sections 210.

Each one of the test sections 210 provided with the access request from the interface section 230 determines whether the provided access request is directed to the test section 210 itself. Each one of the test sections 210, when the provided access request is directed to the test section 210 itself, executes the processing corresponding to the access request. Accordingly, each of the plurality of test control sections 130 is able to control the test section 210 connected to the device under test 10 associated with the test control section 130.

Figure 4:
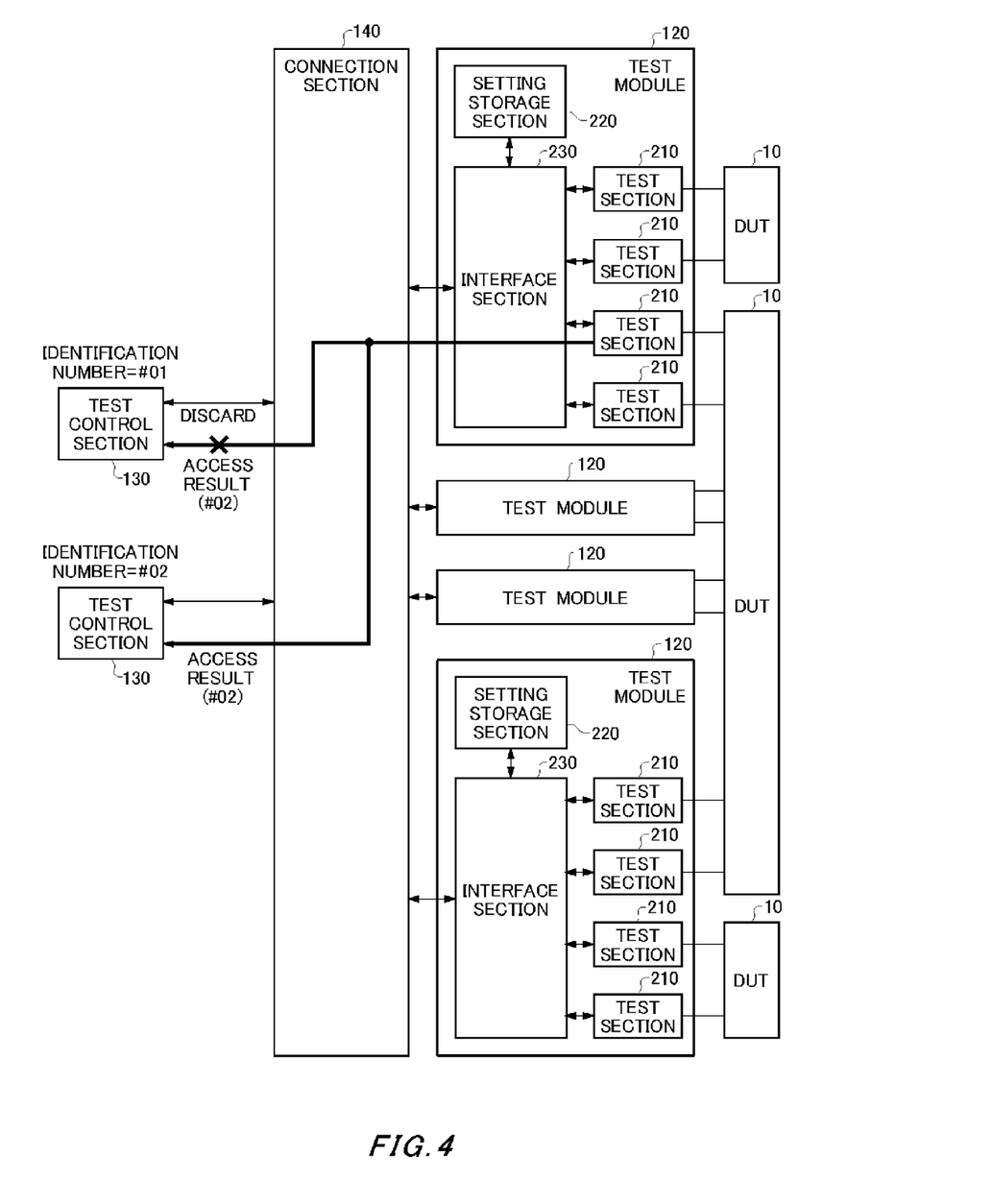
FIG. 4 shows an exemplary access result flow, when transmitting an access result from a test section 210 having received an access request from a test control section 130, to the test control section 130.

FIG. 4 shows an exemplary access result flow, when transmitting an access result from a test section 210 having received an access request from a test control section 130, to the test control section 130. A test section 210, having received an access request from a test control section 130, executes the processing corresponding to the access request. Then, the test section 210 transmits, to the test control section 130, the access result corresponding to the executed processing.

In this case, the test section 210 provides the interface section 230 with an access result corresponding to the provided access request. The interface section 230 reads, from the setting storage section 220, the identification number identifying the test control section 130 associated with the test section 210. The interface section 230 attaches the identification number identifying the test control section 130, to the access result of the test section 210 corresponding to the access request. Then, the interface section 230 transmits the access result assigned the identification, to each of the plurality of test control sections 130 via the connection section 140.

Each of the plurality of test control sections 130 receives the access result via the connection section 140. Each of the plurality of test control sections 130 determines whether the identification number attached to the received access result matches the identification number of the test control section 130. Each of the plurality of test control sections 130 discards the received access result when the identification number attached to the received access result does not match the identification number of the test control section 130.

Each of the plurality of test control sections 130 controls the test module 120 according to the received access result, when the identification number attached to the received access result matches the identification number of the test control section 130. Accordingly, a test control section 130 having transmitted an access request to a test section 210 can receive the corresponding access result from the test section 210, and execute the next processing according to the received access result.

Figure 5:
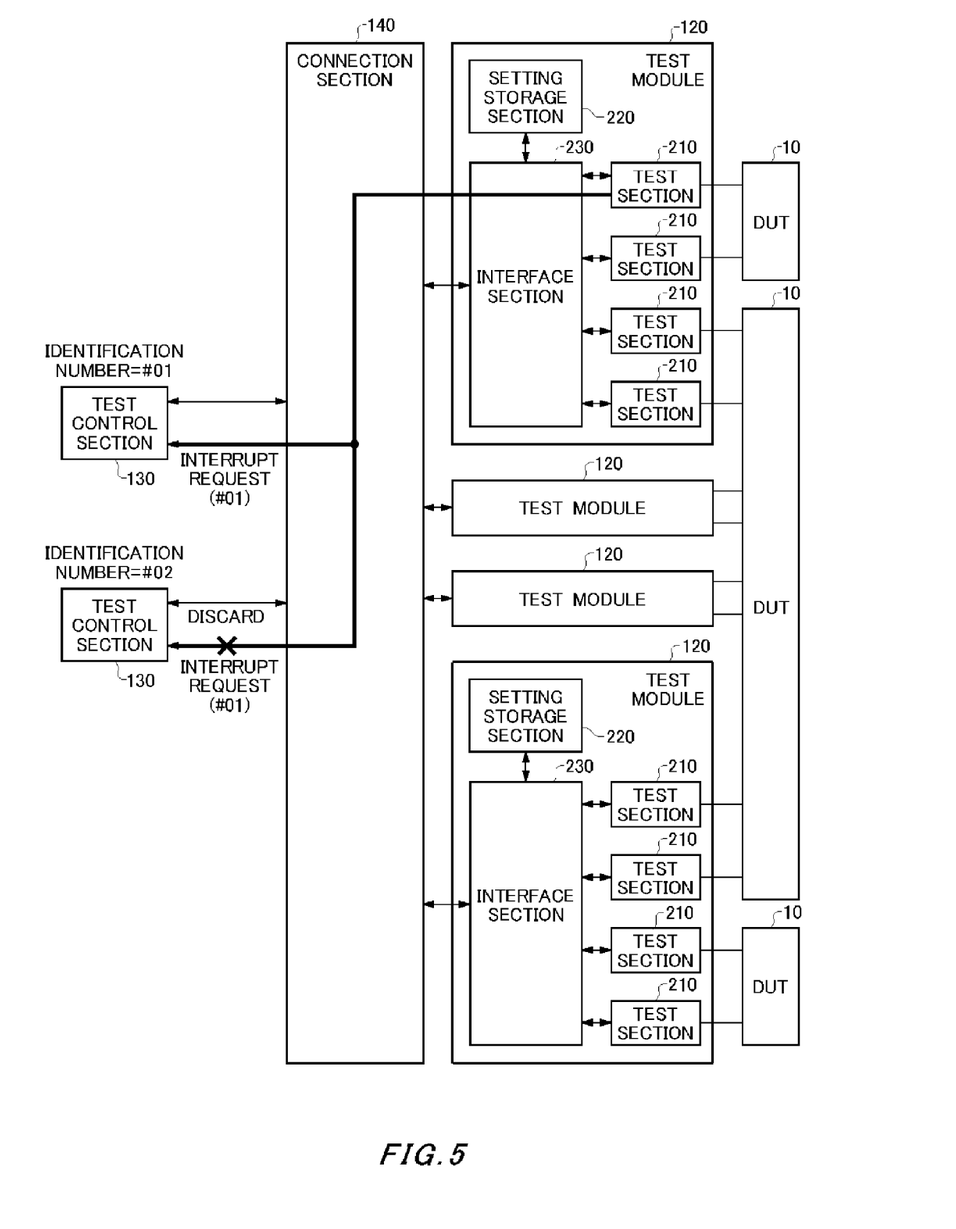
FIG. 5 shows an exemplary interrupt request flow, when transmitting an interrupt request from a test section 210 to a test control section 130 associated with a device under test 10 connected to the test section 210.

FIG. 5 shows an exemplary interrupt request flow, when transmitting an interrupt request from a test section 210 to a test control section 130 associated with a device under test 10 connected to the test section 210. A test section 210 is capable of transmitting an interrupt request to the test control section 130 corresponding to the device under test 10 connected to the test section 210.

In this case, the test section 210 provides the interrupt request to the interface section 230. The interface section 230 reads, from the setting storage section 220, the identification number identifying the test control section 130 associated with the test section 210. The interface section 230 attaches the identification number identifying a test control section 130, to the interrupt request provided from a test section 210 to the test control section 130. Then, the interface section 230 transmits the interrupt request assigned the identification information to each of the plurality of test control sections 130 via the connection section 140.

Each of the plurality of test control sections 130 receives an interrupt request via the connection section 140. Each of the plurality of test control sections 130 determines whether the identification number attached to the received interrupt request matches the identification number of the test control section 130. Each of the plurality of test control sections 130 discards the received interrupt request when the identification number attached to the received interrupt request does not match the identification number of the test control section 130.

Each of the test control sections 130 processes the received interrupt request when the identification number attached to the received interrupt request matches the identification number of the test control section 130. Accordingly, each of the test control sections 130 can process an interrupt request from a corresponding test section 210.

Figure 6:
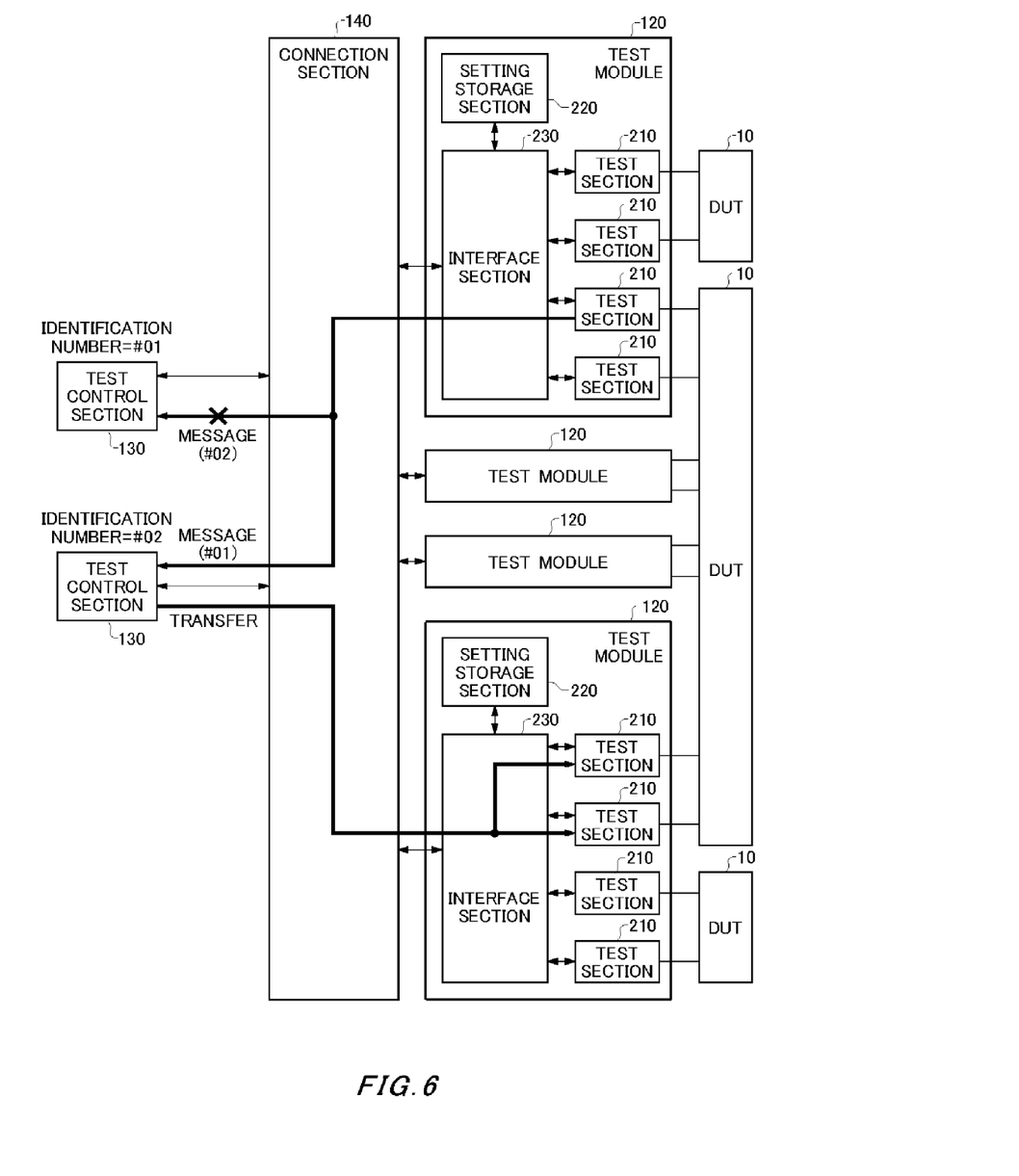
FIG. 6 shows an exemplary message flow, when transmitting a message from a test section 210 included in one of a plurality of test modules 120, to a test section 210 of another test module 120.

FIG. 6 shows an exemplary message flow, when transmitting a message from a test section 210 included in one of a plurality of test modules 120, to a test section 210 of another test module 120. A test section 210 included in a test module 120 of each of the plurality of test modules 120 is able to transmit a message to the test section(s) 210 in another test module 120, according to the processing result.

In this case, a test section 210 included in a test module 120 provides a message to the interface section 230 in a test module 120. The interface section 230 reads, from the setting storage section 220, the identification number identifying the test control section 130 associated with the test section 210. The interface section 230 attaches the identification number identifying a test control section 130, to the message provided from a test section 210 to the test control section 130. Then, the interface section 230 transmits the message assigned the identification information, to each of the plurality of test control sections 130 via the connection section 140.

In this way, a test section 210 provided in one of the plurality of test modules 120 transmits, to a test control section 130, a message directed to another test section 210 included in another test module 120, via the interface section 230 and the connection section 140.

Each of the plurality of test control sections 130 receives the message via the connection section 140. Each of the plurality of test control sections 130 determines whether the identification number attached to the received message matches the identification number of the test control section 130. Each of the plurality of test control sections 130 discards the received message when the identification number attached to the received message does not match the identification number of the test control section 130.

Each of the plurality of test control sections 130 transfers the message to another test section 210 in another test module 120 via the connection section 140 when the identification number attached to the received message matches the identification number of the test control section 130.

The interface section 230 included in the other test module 120 to which the message is transferred receives the message from a test control section 130. The interface section 230 included in the other test module 120 reads, from the setting storage section 220, each test section 210 associated with the identification number attached to the received message. Then, the interface section 230 included in the test module 120 provides the received message to each of the read test sections 210.

Each test section 210 provided with a message from the interface section 230 determines whether the provided message is directed to the test section 120 itself. Each test section 210, if the determination result is in the affirmative, executes the processing corresponding to the message. Accordingly, a test section 210 in a test module 120 can transmit a message to a test section 210 in another test module 120.

Figure 7:
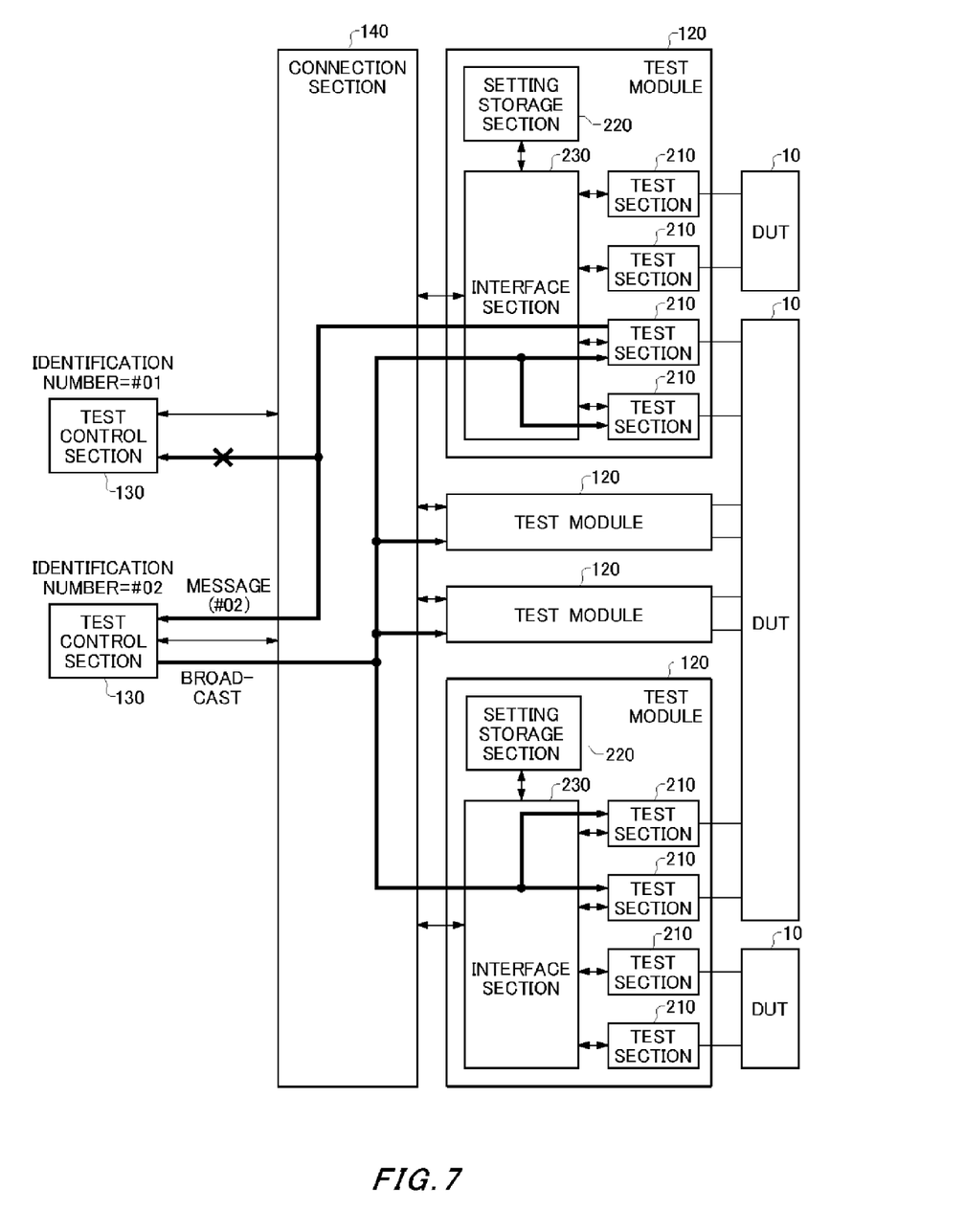
FIG. 7 shows an exemplary message flow, when broadcasting a message from a test section 210 included in one of a plurality of test modules 120, to a test section 210 of a plurality of other test modules 120.

FIG. 7 shows an exemplary message flow, when broadcasting a message from a test section 210 included in one of a plurality of test modules 120, to a test section 210 of a plurality of other test modules 120. A test section 210 included in a test module 120 in each of the plurality of test modules 120 may broadcast a message to a test section 210 included in a plurality of other test modules 120.

In this case, the processing up to a point at which each of the plurality of test control sections 130 has received a message from a test module 120 is the same as the processing depicted in FIG. 6. Each of the plurality of test control sections 130 discards the received message when the identification number attached to the received message does not match the identification number of the test control section 130.

One of the plurality of test control sections 130 whose identification number matches the identification number attached to the received message, when receiving a message to be broadcast from a test module 120 to the plurality of test modules 120, transfers the message to the plurality of test modules 120 via the connection section 140. That is, a test control section 130 broadcasts the received message to the plurality of test modules 120.

The interface section 230 included in each of the plurality of other test modules 120 to which the message is transferred receives the message broadcast by the test control section 130. The interface section 230 included in each of the plurality of other test modules 120 reads, from the setting storage section 220, each test section 210 associated with the identification number attached to the received message. Then, the interface section 230 included in each of the plurality of other test modules 120 provides the received message to each of the read test sections 210.

Each one of the test sections 210 provided with the access request from the interface section 230 determines whether the provided access request is directed to the test section 210 itself. Each one of the test sections 210, when the provided access request is directed to the test section 210 itself, executes the processing corresponding to the access request. Accordingly, a test section 210 in a test module 120 can broadcast a message to a test section 210 in a plurality of other test modules 120.

Figure 8:
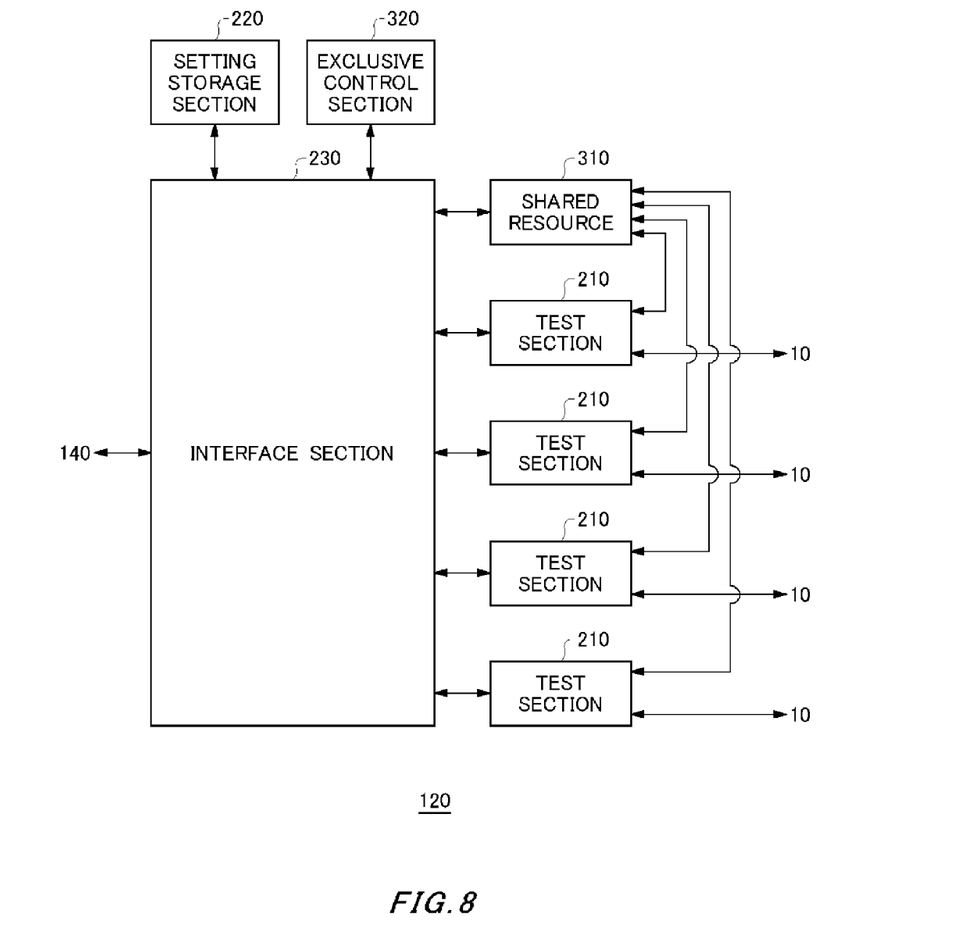
FIG. 8 shows a configuration of a test module 120 according to a modification example of the present embodiment.

FIG. 8 shows a configuration of a test module 120 according to a modification example of the present embodiment. A test module 120 according to the present modification example adopts a configuration and a function that are substantially the same as those of the test module 120 shown in FIG. 2, and so the same reference numerals are attached to these members substantially the same as those in FIG. 2, and the following only focuses on the differences.

The test module 120 according to the present modification example further includes a shared resource 310 and a exclusive control section 320. The shared resource 310 is a resource (e.g., circuit, sequencer, etc.) used for testing a device under test 10, and shared by at least two of a plurality of test sections 210. The exclusive control section 320 controls the exclusive license of the shared resource 310. That is, the exclusive control section 320 controls any one of the test control sections 130 to exclusively use the shared resource 310, in response to the exclusive use request from each of the plurality of test control sections 130.

In the stated modification example, a test control section 130 transmits an exclusive request to the exclusive control section 320 via the interface section 230. Then, the test control section 130 connects a shared resource 310 to a test section 210 that is under control of the test control section 130, on condition that the exclusive license is obtained. The shared resource 310 connected to the test section 210 cooperates with the test section 210 to test the device under test 10 connected to the test section 210. Accordingly, each of the plurality of test control sections 130 can share a shared resource 310 in a time sharing manner.

Furthermore, the exclusive control section 320 may control the exclusive license of each of the plurality of test sections 210. That is, the exclusive control section 320 controls any one of the test control sections 130 to exclusively use each of the plurality of test sections 210, in response to the exclusive use request from each of the plurality of test control sections 130.

In this case, a test control section 130 transmits, to the exclusive control section 320 via the interface section 230, an exclusive request to each of the plurality of test sections 210. Then, the test control section 130 connects each of the plurality of test sections 210 to a device under test 10 to be associated with the test control section 130, on condition that the exclusive license is obtained.

Then, the test section 210 connected to the device under test 10 associated with the test control section 130 tests the device under test 10, by being controlled by the test control section 130. Accordingly, each of the plurality of test control sections 130 can share each of a plurality of shared resources 310 in a test module 120 in a time sharing manner.

Figure 9:
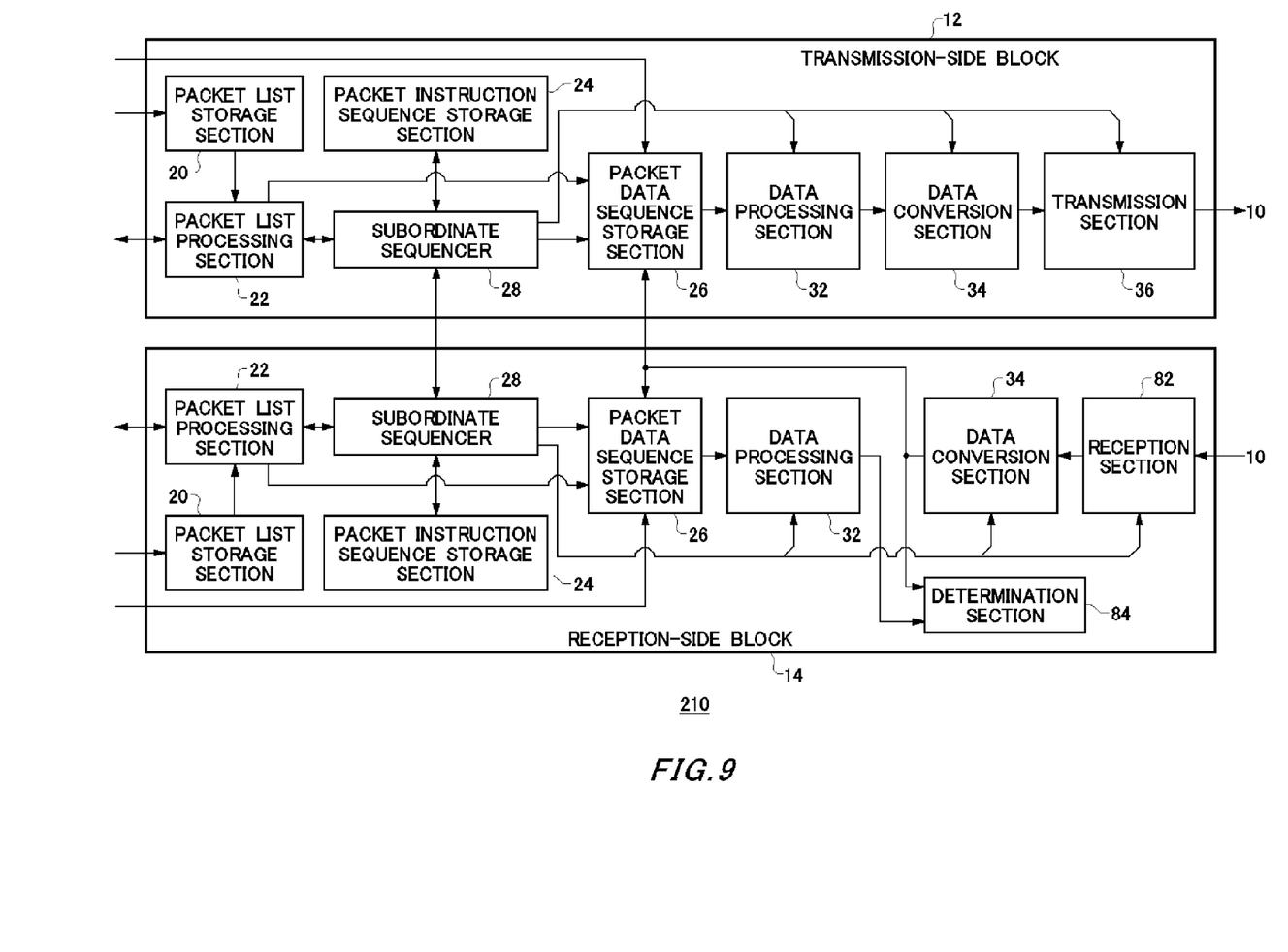
FIG. 9 shows an exemplary configuration of a test section 210 according to the present embodiment.

FIG. 9 shows an exemplary configuration of the test section 210. Note that the test section 210 may have another configuration different from the illustrated configuration.

The test section 210 includes a transmission-side block 12 and a reception-side block 14, for example. The test section 210 may have a configuration of having only one of the transmission-side block 12 or the reception-side block 14.

The transmission-side block 12 transmits, to the device under test 10, the packets in the order designated by a packet list. The reception-side block 14 receives a packet from the device under test 10, compares the packets designated in the packet list with the received packet, and determines acceptability of the device under test 10.

The following explains the transmission-side block 12. The transmission-side block 12 includes a packet list storage section 20, a packet list processing section 22, a packet instruction sequence storage section 24, a packet data sequence storage section 26, a subordinate sequencer 28, a data processing section 32, a data conversion section 34, and a transmission section 36. The packet list storage section 20 stores a plurality of packet lists having been supplied.

The packet list processing section 22 executes the packet lists that are stored in the packet list storage section 20 and that are designated from outside, to sequentially designate packets to be exchanged with the device under test 10. For example, the packet list processing section 22 executes a packet list according to the address received from outside, and sequentially designates the packets to transmit to the device under test 10.

For example, the packet list processing section 22 designates the address in the packet instruction sequence storage section 24, which stores the instruction sequence for generating the designated packet. For example, the packet list processing section 22, for a packet to be exchanged with the device under test 10, designates the address (e.g. the first address) of the data sequence included in the packet, within the packet data sequence storage section 26.

In this way, the packet list processing section 22 designates the address of the instruction sequence for generating a packet and the address of the data sequence included in the packet, independently from each other. Note that in this case, when there is a common instruction sequence or a common data sequence designated for two or more packets in a packet list, the packet list processing section 22 may designate, for the two or more packets, the address of the same instruction sequence or the address of the same data sequence.

The packet instruction sequence storage section 24 stores instruction sequences respectively for generating a plurality of types of packets, for each type of packet. For example, the packet instruction sequence storage section 24 stores an instruction sequence for generating a write packet, an instruction sequence for generating a read packet, and an instruction sequence for generating an idle packet.

The packet data sequence storage section 26 stores data sequences respectively included in the plurality of types of packets, for each type of packet. For example, the packet data sequence storage section 26 stores a data sequence included in a write packet, a data sequence included in a read packet, and a data sequence included in an idle packet. In addition, the packet data sequence storage section 26 may store individual data of each packet, and the common data common for each type of packets, in different storage areas from each other, for example.

Furthermore, the transmission-side packet data sequence storage section 26 receives reception data included in the packet received by the reception section 82 in the reception-side block 14, from the data conversion section 34 within the reception-side block 14. Then, the transmission-side packet data sequence storage section 26 stores the reception data included in the packet received by the reception section 82 in the reception-side block 14.

The subordinate sequencer 28 reads the instruction sequence of the packet designated by the packet list processing section 22, i.e. the instruction sequence whose address is designated by the packet list processing section 22, from the packet instruction sequence storage section 24, and sequentially executes each instruction included in the read instruction sequence. Furthermore, the subordinate sequencer 28 causes the packet data sequence storage section 26 to sequentially output, in response to the execution of the instruction sequences, the data sequence of the packet designated by the packet list processing section 22, i.e. the data sequence whose address is designated by the packet list processing section 22, to generate a test data sequence used for a test of the device under test 10.

For each execution of an instruction, the subordinate sequencer 28 supplies, to the data processing section 32 and the data conversion section 34, control data instructing to perform the designated processing (operation or data conversion) to the read individual data and common data. Accordingly, the subordinate sequencer 28 may set the designated part of the data in the packet designated by the packet list processing section 22, as the read data having undergone the designated processing.

The subordinate sequencer 28 may supply a completion notification to the packet list processing section 22, upon completion of the execution of the instruction sequence of the packet designated by the packet list processing section 22. Accordingly, the packet list processing section 22 can sequentially designate packets according to the progress of the execution of instruction sequences in the subordinate sequencer 28.

In addition, the transmission-side subordinate sequencer 28 included in the transmission-side block 12 designates, to the transmission section 36, the edge timing of the signal to be transmitted to the device under test 10. The subordinate sequencer 28 may, for example, supply a timing signal to the transmission section 36, to control the edge timing for each packet.

In addition, the transmission-side subordinate sequencer 28 communicates with the reception-side subordinate sequencer 28 included in the reception-side block 14. Accordingly, the transmission-side subordinate sequencer 28 can handshake with the reception-side subordinate sequencer 28, to execute the instruction sequence in synchronization with the reception-side subordinate sequencer 28.

The transmission-side subordinate sequencer 28 notifies the reception-side subordinate sequencer 28, of completion of transmission of the test data sequence of the pre-designated packet to the device under test 10, for example. Accordingly, the transmission-side subordinate sequencer 28 can prohibit the reception-side subordinate sequencer 28 from determining the acceptability of the received data sequence, for a period until a notification from the transmission-side subordinate sequencer 28 is received.

Upon reception of the notification that the data sequence matching the generated test data sequence is received from the reception-side subordinate sequencer 28, the transmission-side subordinate sequencer 28 generates a test data sequence of the pre-designated packet, for example. Accordingly, the transmission-side subordinate sequencer 28 can transmit the pre-designated packet to the device under test 10, after reception of a predetermined packet from the device under test 10.

The data processing section 32 reads, from the packet data sequence storage section 26, the data sequence of the packet designated by the packet list processing section 22, and generates a test data sequence used for testing the device under test 10. In this case, the transmission-side data processing section 32 may include, within the test data sequence according to the packet to transmit to the device under test 10, a value according to the reception data included in the packet received by the reception section 82 within the reception-side block 14.

For example, the transmission-side data processing section 32 reads data from the transmission-side packet data sequence storage section 26, and generates a test data sequence designating, as the value according to the reception data (e.g. the value of the reception data as it is, or a value resulting from performing certain processing on the reception data), a pre-designated part of the data sequence of the packet to transmit to the device under test 10. The described transmission-side data processing section 32 may transmit the value according to the reception data included in the packet received from the device under test 10, by including it in a packet.

At a timing designated by the subordinate sequencer 28, the data conversion section 34 performs data conversion on the test data sequence outputted from the data processing section 32. For example, the data conversion section 34 performs 8b-10b conversion by means of a table pre-set to the test data sequence. In another example, the data conversion section 34 may perform scrambling on the test data sequence. Then the data conversion section 34 outputs the converted data sequence.

The transmission section 36 transmits, to the device under test 10, the test data sequence generated by the data conversion section 34.

The following explains the reception-side block 14. The reception-side block 14 has substantially the same configuration and function as the transmission-side block 12, and so the following explanation of the reception-side block 14 focuses on the differences from the transmission-side block 12.

The reception-side block 14 includes a packet list storage section 20, a packet list processing section 22, a packet instruction sequence storage section 24, a packet data sequence storage section 26, a subordinate sequencer 28, a data processing section 32, a data conversion section 34, a reception section 82, and a determination section 84. The reception section 82 receives a data sequence of a packet from a device under test 10.

The reception-side data conversion section 34 performs data conversion on the data sequence received by the reception section 82, at a timing designated by the reception-side subordinate sequencer 28. For example, the reception-side data conversion section 34 performs 8b-10b conversion by means of a table pre-set to the received test data sequence. In another example, the reception-side data conversion section 34 may perform descrambling on the received data sequence.

Then, the reception-side data conversion section 34 supplies the converted data sequence to the determination section

84. The reception-side data conversion section 34 may also supply the converted data sequence to at least one of the reception-side packet data sequence storage section 26 or the transmission-side packet data sequence storage section 26.

The reception-side packet list processing section 22 executes the packet lists designated from outside, and sequentially designates the packets expected to be received from the device under test 10. In addition, the reception-side data processing section 32 supplies the generated test data sequence to the determination section 84.

The reception-side subordinate sequencer 28 causes the reception-side packet data sequence storage section 26 to output the data sequence of the packet expected to be outputted from the device under test 10, as the test data sequence. In addition, the reception-side subordinate sequencer 28 designates, to the reception section 82, a strobe timing at which the data value of the signal outputted from the device under test 10 is taken in.

The determination section 84 receives the test data sequence from the reception-side data processing section 32, as well as receiving the data sequence received from the reception-side data conversion section 34. The determination section 84 determines the acceptability of the communication with the device under test 10, based on the result of comparing the received data sequence and the test data sequence. The determination section 84, for example, includes a logic comparing section and a fail memory, where the logic comparing section compares whether the data sequence received by the reception section 82 matches the test data sequence, and the fail memory stores the comparison result. In addition, the determination section 84 may notify the reception-side subordinate sequencer 28 of the matching between the data sequence received by the reception section 82 and the designated data sequence, for example.

In addition, the reception-side subordinate sequencer 28 communicates with the transmission-side subordinate sequencer 28. Accordingly, the reception-side subordinate sequencer 28 can handshake with the transmission-side subordinate sequencer 28, to execute the instruction sequence in synchronization with the transmission-side subordinate sequencer 28.

The reception-side subordinate sequencer 28, for example, notifies the transmission-side subordinate sequencer 28 of reception of the data sequence that matches the test data sequence generated by the reception-side subordinate sequencer 28. Accordingly, the transmission-side subordinate sequencer 28 can generate the test data sequence of a pre-designated packet, upon reception of the notification that the data sequence that matches the generated test data sequence has been received from the reception-side subordinate sequencer 28.

In addition, the reception-side subordinate sequencer 28 prohibits the determination section 84 from determining the acceptability of the data sequence received by the reception section 82, for a period until notification of transmission of the test data sequence of the pre-designated packet to the device under test 10 is received from the transmission-side subordinate sequencer 28. Accordingly, after transmitting a predetermined packet to the device under test 10, the reception-side subordinate sequencer 28 can determine whether a response in response to the predetermined packet has been outputted from the device under test 10.

The reception-side packet data sequence storage section 26 receives reception data included in the packet received by the reception section 82 from the data conversion section 34 in the reception-side block 14. Then, the reception-side packet data sequence storage section 26 stores the reception data included in the packet received by the reception section 82.

Furthermore, the reception-side data processing section 32 incorporates, in the test data sequence included in the packet expected to be outputted from the device under test 10, the value according to the reception data included in the packet already received by the reception section 82. For example, the reception-side data processing section 32 reads the data from the reception-side packet data sequence storage section 26, and generates a test data sequence designating, as the value according to the reception data (e.g. the value of the reception data as it is, or a value resulting from performing certain processing on the reception data), a pre-designated part of the data sequence of the packet expected to be received from the device under test 10.

For example, the reception-side data processing section 32 may incorporate a value according to reception data included in a first packet already received by the reception section 82, within a test data sequence according to a second packet to be received from the device under test 10. Accordingly, the reception-side data processing section 32 can refer to the ID or the like included in the packet received from the device under test 10, for example, so as to determine whether the IDs included in the subsequent packets are valid or not.

As described above, the test apparatus 100 according to the present embodiment can perform, in a position comparatively near the device under test 10, the processing to incorporate, in the subsequent packets, the value according to the reception data included in the received packet. Consequently, the test apparatus 100 can quickly respond to the communication with the device under test 10.

Moreover, the test apparatus 100 should desirably include a data processing section 32 realized by an operation processing unit having a comparatively high operating frequency, for example. By doing so, the test apparatus 100 can quickly perform the processing to generate data to be included in the subsequent packets using the data included in the received packet.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A test apparatus for testing at least one device under test, comprising:
    a test module that includes a plurality of test sections, the plurality of test sections testing the device under test by exchanging signals with the device under test; and
    a plurality of test control sections that control the plurality of test sections, wherein the test module is able to set, independently for each of the plurality of test sections, which of the plurality of test control sections should control the test section.

2. The test apparatus according to claim 1, wherein the test module includes:
  a setting storage section that stores ,a setting as to which of the plurality of test control sections should be associated with each of the plurality of test sections; and
  an interface section that is connected to the plurality of test sections, and provides an access request issued from one of the plurality of test control sections and directed to the test module, to the one of the plurality of test sections associated with the one of the plurality of test control sections.

3. The test apparatus according to claim 2, wherein
  the setting storage section stores, for each of the plurality of test sections, an identification number identifying one of the plurality of test control sections that is associated with the test section,
  the test control section transmits the access request including the identification number identifying the one of the plurality of test control sections as an attachment, and
  the interface section reads, from the setting storage section, the one of the plurality of test sections associated with the identification number attached to the access request having been received, and provides the access request to the one of the plurality of test sections.

4. The test apparatus according to claim 2, wherein
  the interface section transmits an access result of the test section corresponding to the access request, the access result including an identification number of the one of the plurality of test control sections as an attachment, and
  each of the plurality of test control sections receives the access result of the test section corresponding to the access request, (a) discards the access result when the identification number attached to the access result does not match the identification number of the one of the plurality of test control sections, and (b) controls the test module according to the access result when the identification number attached to the access result matches the identification number of the one of the plurality of test control sections.

5. The test apparatus according to claim 2, wherein
  the interface section transmits an interrupt request issued from the test section corresponding to the access request and directed to the one of the plurality of test control sections, the interrupt request including an identification number of the one of the plurality of test control sections as an attachment, and
  each of the plurality of test control sections receives the interrupt request of the test corresponding to the access request, (a) discards the interrupt request when the identification number attached to the interrupt request does not match the identification number of the one of the plurality of test control sections, and (b) processes the interrupt request when the identification number attached to the interrupt request matches the identification number of the one of one of the plurality of test control sections.

6. The test apparatus according to claim 2, wherein
  the test module further includes an exclusive control section that controls an exclusive license of each of the plurality of test sections, and
  the one of the plurality of test control sections transmits an exclusive request to the exclusive control section via the interface section, and uses the test section corresponding to the access request on a condition that the exclusive license is obtained.

7. The test apparatus according to claim 2, wherein the test module includes:
  a shared resource shared by at least two of the plurality of test sections; and
  an exclusive control section that controls an exclusive license of the shared resource, wherein
  the one of the plurality of test control sections transmits an exclusive request to the exclusive control section via the interface section, and connects the shared resource to the test section that is controlled by the one of the plurality of test control sections, on a condition that the exclusive license is obtained, and
  the shared resource connected to the test section that is controlled by the one of the plurality of test control sections tests the device under test by cooperating with the other of the plurality of test sections sharing the shared resource.

8. The test apparatus according to claim 2, further comprising:
  a plurality of test modules; and
  a connection section that connects the plurality of test control sections with the plurality of test modules, wherein
  the test section included in one of the plurality of test modules transmits, to one of the plurality of test control sections via the interface section and the connection section, a message directed to another test section included in another of the plurality of test modules, and
  the one of the plurality of test control sections transfers the message to the other test section in the other of the plurality of test modules via the connection section.

9. An apparatus comprising:
  a test module that includes a plurality of test sections, the plurality of test sections testing the device under test by exchanging signals with the device under test;
  wherein the test module is able to set, independently for each of the plurality of test sections, one of a plurality of test control sections to control the test section.

* * * * *